(12) United States Patent
Komai et al.

(10) Patent No.: US 9,991,400 B2
(45) Date of Patent: *Jun. 5, 2018

(54) COLLECTOR SHEET FOR SOLAR CELL AND SOLAR CELL MODULE EMPLOYING SAME

(71) Applicant: Dai Nippon Printing Co., Ltd., Tokyo (JP)

(72) Inventors: Takayuki Komai, Tokyo (JP); Satoshi Emoto, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 83 days.

This patent is subject to a terminal disclaimer.

(21) Appl. No.: 15/041,121

(22) Filed: Feb. 11, 2016

(65) Prior Publication Data
US 2016/0163885 A1 Jun. 9, 2016

Related U.S. Application Data

(63) Continuation of application No. 14/238,819, filed as application No. PCT/JP2012/055058 on Feb. 29, 2012, now Pat. No. 9,293,607.

(51) Int. Cl.
*H02N 6/00* (2006.01)
*H01L 31/042* (2014.01)
(Continued)

(52) U.S. Cl.
CPC .... *H01L 31/02008* (2013.01); *H01L 31/0203* (2013.01); *H01L 31/02245* (2013.01);
(Continued)

(58) Field of Classification Search
CPC ............... H01L 31/02008; H01L 31/0516
See application file for complete search history.

(56) References Cited

U.S. PATENT DOCUMENTS 7,521,515 B2 4/2009 Oi et al.
8,119,901 B2 2/2012 Jang et al.
(Continued)

FOREIGN PATENT DOCUMENTS

CN 101647124 A 2/2010
CN 101874305 A 10/2010
(Continued)

OTHER PUBLICATIONS

Office Action dated Jul. 13, 2016 issued for corresponding European Patent Application No. 12870091.1.
(Continued)

*Primary Examiner* — Eli Mekhlin
(74) *Attorney, Agent, or Firm* — Locke Lord LLP

(57) ABSTRACT

Provided is a collector sheet for a solar cell, wherein the collector sheet for solar cell can prevent short circuiting between a non-photoreception surface side element and a wiring section, as well as cushioning shocks. This collector sheet (2) for a solar cell has a circuit (22) on the surface of a resin substrate (21). A sealing material layer (23) is stacked on the circuit (22), and in the sealing material layer (23) on the wiring section (221) is formed a conductive recessed part (24) through which the wiring section (221) is exposed, in order to provide conductivity between an electrode (4) on the non-photoreception surface side of the solar cell element (1), and the wiring section (221) corresponding thereto, with the sealing material layer (23) therebetween.

7 Claims, 6 Drawing Sheets

(51) Int. Cl.
    *H01L 31/02*     (2006.01)
    *H01L 31/048*     (2014.01)
    *H01L 31/05*     (2014.01)
    *H01L 31/0224*     (2006.01)
    *H01L 31/049*     (2014.01)
    *H01L 31/0203*     (2014.01)

(52) U.S. Cl.
    CPC ........ *H01L 31/049* (2014.12); *H01L 31/0481* (2013.01); *H01L 31/0516* (2013.01); *Y02E 10/50* (2013.01)

(56) References Cited

U.S. PATENT DOCUMENTS

| | | |
|---|---|---|
| 2002/0134422 A1 | 9/2002 | Bauman et al. |
| 2006/0142490 A1 | 6/2006 | Oi |
| 2009/0032087 A1 | 2/2009 | Kalejs |
| 2010/0200058 A1 | 8/2010 | Funakoshi |
| 2010/0263718 A1* | 10/2010 | Abiko ............. H01L 31/022441 136/252 |
| 2011/0036390 A1 | 2/2011 | Nelson et al. |
| 2011/0041890 A1 | 2/2011 | Sheats |
| 2011/0100417 A1* | 5/2011 | Jang .................... H01L 31/0516 136/244 |
| 2011/0132426 A1* | 6/2011 | Kang ................ H01L 31/02245 136/244 |
| 2012/0097210 A1 | 4/2012 | Jang et al. |
| 2012/0266943 A1* | 10/2012 | Li ....................... H01L 31/0481 136/251 |

FOREIGN PATENT DOCUMENTS

| | | |
|---|---|---|
| CN | 102136508 A | 7/2011 |
| EP | 2211389 A1 | 7/2010 |
| EP | 2317566 A2 | 5/2011 |
| EP | 2416385 A1 | 2/2012 |
| FR | 2877144 A1 | 4/2006 |
| JP | 2005-019975 A | 1/2005 |
| JP | 2007081237 A | 3/2007 |
| JP | 2009088145 A | 4/2009 |
| JP | 2010157553 A | 7/2010 |
| JP | 2011114205 A | 6/2011 |
| JP | 2011199020 A | 10/2011 |
| JP | 2011238849 A | 11/2011 |
| JP | 2012033870 A | 2/2012 |
| WO | WO-2008/097517 A1 | 8/2008 |
| WO | WO-2009041212 A1 | 4/2009 |
| WO | 2009/134939 A2 | 11/2009 |
| WO | WO-2010110083 A1 | 9/2010 |
| WO | WO-2010150749 A1 | 12/2010 |
| WO | WO-2012/158215 A1 | 11/2012 |

OTHER PUBLICATIONS

International Search Report of PCT/JP2012/055058.
Extended European Search Report issued to EP Application No. 12870091.1, dated Jul. 9, 2015.
Office Action dated Dec. 29, 2015 issued for corresponding Chinese Patent Application No. 201280044426.6.
Office Communication dated Jan. 24, 2017 issued for corresponding European Patent Application No. 12870091.1.

* cited by examiner

COLLECTOR SHEET FOR SOLAR CELL AND SOLAR CELL MODULE EMPLOYING SAME

This application is a continuation application of U.S. application Ser. No. 14/238,819, filed Feb 13, 2014, now U.S. Pat. No. 9,293,607, issued Mar. 22, 2016, which is a National Stage Entry of PCT/JP2012/055058 filed Feb. 29, 2012.

TECHNICAL FIELD

This invention relates to a collector sheet for a solar cell for extracting electricity from a back contact solar cell element, and a solar cell module employing the same.

BACKGROUND ART

In recent years, solar cells have been receiving attention as a clean energy source due to the rise in awareness of environmental problems. In general, a solar cell module constituting a solar cell has a configuration in which a transparent front substrate, a front surface side sealing material sheet, a solar cell element, a rear front side sealing material sheet, and a rear surface protective sheet are laminated sequentially from the photoreception surface side, and has the function of generating electricity by sunlight being incident on the solar cell element.

Solar cell elements that generate electricity inside a solar cell module are generally provided in a plurality of numbers inside the solar cell module, and are configured so as to be connected in series/parallel, to obtain the required current and voltage. In order to wire the plurality of solar cell elements inside the solar cell module, for example, a collector sheet is used for a solar cell which is formed by laminating metal foil to become a circuit on the surface of a resin sheet as a base material (see Patent Document 1).

Incidentally, the solar cell element has a photoreception surface to receive sunlight and a non-photoreception surface located on the rear side thereof, and there is known a back contact solar cell element in which an electrode is not disposed on the photoreception surface but a plurality of electrodes with different polarities are disposed on the non-photoreception surface so as to enhance the photoreception efficiency of sunlight on the photoreception surface.

There are a variety of types of back contact solar cell elements. Other than a solar cell element of a metal wrap through (MWT) type, or an emitter wrap through (EWT) type, which includes a semiconductor substrate having a plurality of through holes that penetrate between the photoreception surface and the non-photoreception surface and in which a plurality of electrodes with different polarities are provided on the non-photoreception surface, there exists a solar cell element with a structure having no through holes.

Herein, especially in the case of extracting electricity directly from the electrode of the solar cell element with a structure having through holes, there is a risk of short circuiting between the non-photoreception surface side element as a P-electrode and the wiring section corresponding to an N-electrode.

Such short circuiting can be prevented by forming an insulating layer on the circuit of the collector sheet for a solar cell. Patent Document 2 discloses a solar cell module in which an insulating layer configured of an insulating adhesive is formed on the circuit of the collector sheet for a solar cell.

On the other hand, in recent years, there are some cases where the solar cell element cracks or a contact failure occurs in a joining section of the solar cell element and the circuit on the collector sheet for a solar cell due to a slight shock from the outside, but the insulating adhesive is typically a curing resin cured by heat, UV or the like, and hence the insulating layer after curing does not have shock resistant properties, whereby it is not possible to achieve the effect of softening shocks from the outside only by means of the insulating layer.

[Patent Document 1] Japanese Unexamined Patent Application, Publication No. 2007-081237

[Patent Document 2] Japanese Unexamined Patent Application, Publication No. 2010-157553

DISCLOSURE OF THE INVENTION

Problems to be Solved by the Invention

For this reason, a collector sheet for a solar cell has been sought which is capable of safely extracting electricity without giving rise to short circuiting, as well as sufficiently softening shocks from the outside.

The present invention has been made in view of such circumstances, and an object of the present invention is to provide a collector sheet for a solar cell and a method for producing the same, the sheet being a collector sheet for a solar cell which is joined to a back contact solar cell element and is capable of reliably preventing short circuiting between, for example, a non-photoreception surface side element as a P-electrode and a wiring section corresponding to an N-electrode, as well as sufficiently softening shocks from the outside on the solar cell element and a joining section of the solar cell element and a circuit.

Means for Solving the Problems

The present inventors conducted extensive studies in order to solve the above problems, and found as a result that the above short circuiting can be prevented and shocks from the outside can also be sufficiently softened by forming a sealing material layer, provided with an insulating effect on top of the original effect of shock softening, on the circuit of the collector sheet for a solar cell, thus leading to completion of the present invention. Specifically, the present invention provides the following.

(1) A collector sheet for a solar cell which is disposed, as internal wiring of a solar cell module, on the rear surface side of a back contact solar cell element, the sheet including: a circuit which is formed on the surface of a resin base material, and configured of a wiring section made of a metal and a non-wiring section; and a sealing material layer which is laminated on the circuit, wherein the sealing material layer on the wiring section is formed with a conductive recessed section where the wiring section is exposed for providing conductivity between an electrode on the non-photoreception surface side of the solar cell element and the wiring section corresponding thereto via the sealing material layer.

(2) The collector sheet for a solar cell according to (1), including as the conductive recessed section: a first conductive recessed section corresponding to the position of a first electrode being one of the positive and negative electrodes formed on the non-photoreception surface side through a through hole from the photoreception surface side element of the solar cell element; and a second conductive recessed section corresponding to the position of a second electrode being the other of the positive and negative electrodes on the non-photoreception surface of the solar cell element.

(3) A collector sheet for a solar cell which is disposed, as internal wiring of a solar cell module, on the rear surface side of a back contact solar cell element, the sheet including: a circuit which is formed on the surface of a resin base material, and configured of a wiring section made of a metal and a non-wiring section; an insulating layer which is formed on the circuit; and a sealing material layer which is formed on the insulating layer, wherein the insulating layer and the sealing material layer on the wiring section are formed with a conductive recessed section where the wiring section is exposed to provide conductivity between an electrode on the non-photoreception surface side of the solar cell element and the wiring section corresponding thereto via the insulating layer and the sealing material layer.

(4) The collector sheet for a solar cell according to (3), including as the conductive recessed section: a first conductive recessed section corresponding to the position of the first electrode being one of the positive and negative electrodes formed on the non-photoreception surface side through a through hole from the photoreception surface side element of the solar cell element; and a second conductive recessed section corresponding to the position of the second electrode being the other of the positive and negative electrodes on the non-photoreception surface of the solar cell element.

(5) The collector sheet for a solar cell according to (1) or (2), wherein the volume resistance value measured based on JIS C6481 is $10^7\Omega$ or more.

(6) The collector sheet for a solar cell according to (1), (2) or (5) wherein the sealing material layer is a polyethylene-based resin or ionomer.

(7) The collector sheet for a solar cell according to (3) or (4), wherein the insulating layer is an ultraviolet curable insulating layer.

(8) The collector sheet for a solar cell, integrated with a rear surface protective sheet, according to any one of (1) to (7), wherein the rear surface protective sheet is integrated on the rear surface side of the resin base material.

(9) A method for producing the collector sheet for a solar cell according to any one of (1), (2), (5) or (6), including the steps of: laminating metal foil on the surface of a resin base material and then etching the metal foil to form a circuit; and forming a through hole that constitutes the conductive recessed section in the sealing material layer, to laminate the sealing material layer on the circuit.

(10) A method for producing the collector sheet for a solar cell according to any one of (3), (24), or (7), including the steps of: laminating metal foil on the surface of a resin base material and then etching the metal foil to form a circuit; pattern-forming the insulating layer on the wiring section and the non-wiring section except for the conductive recessed section; and forming a through hole that constitutes the conductive recessed section in the sealing material layer to laminate the sealing material layer on the insulating layer.

(11) A solar cell module which includes a joining member formed by laminating the collector sheet for a solar cell according to (2) or (4) on the non-photoreception surface side of a back contact solar cell element, wherein the solar cell element is configured of a photoreception surface side element and a non-photoreception surface side element, and provided with a first electrode which is one of the positive and negative electrodes formed on the non-photoreception surface side through a through hole from the photoreception surface side element, and a second electrode which is the other of the positive and negative electrodes on the non-photoreception surface, the conductive recessed section of the collector sheet for a solar cell is filled with a conductive material, the first electrode and the conductive material within the first conductive recessed section are joined so as to provide conductivity between them, and the second electrode and the conductive material within the second conductive recessed section are joined so as to provide conductivity between them.

(12) A solar cell module, including: a circuit which is formed on the surface of a resin base material, and configured of a metal wiring section and a non-wiring section; a sealing material layer which is laminated on the circuit or on an insulating layer formed on the circuit; and a back contact solar cell element laminated on the sealing material layer.

Effects of the Invention

According to the present invention, a collector sheet for a solar cell and a method for producing the same are provided, the sheet being a collector sheet for a solar cell which is joined to a back contact solar cell element and capable of reliably preventing short circuiting between, for example, the non-photoreception surface side element as a P-electrode and the wiring section corresponding to an N-electrode, as well as sufficiently softening shocks from the outside on the solar cell element and the like.

EXPLANATION OF REFERENCE NUMERALS

Figure 1:
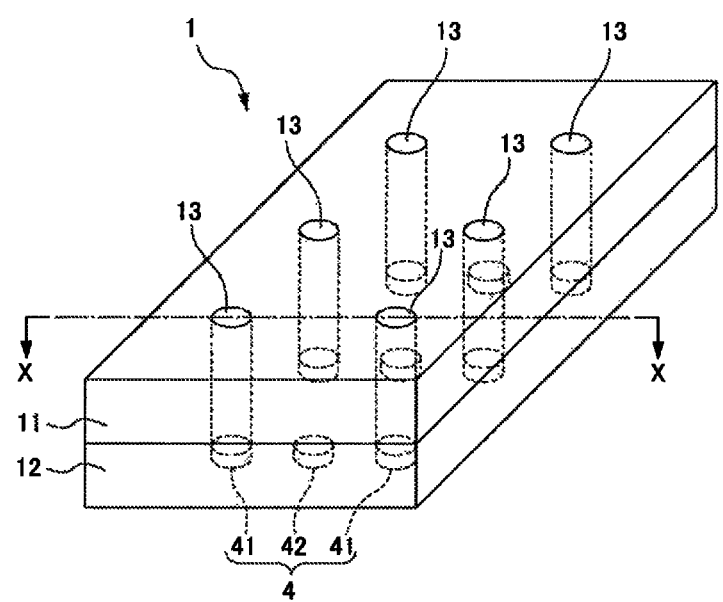
FIG. 1 is a perspective view schematically representing a back contact solar cell element having through holes.

1. Solar cell element
13. Through hole
2, 2A. Collector sheet for a solar cell
21. Resin base material
22. Circuit
23. Sealing material layer
24. Conductive recessed section
25. Conductive material
26. Insulating layer
3. Joining member of solar cell element and collector sheet for a solar cell
4. Electrode
41. First electrode
42. Second electrode

PREFERRED MODE FOR CARRYING OUT THE INVENTION

Hereinafter, a collector sheet for a solar cell and a method for producing the same according to the first embodiment of the present invention will be described.

Figure 2:
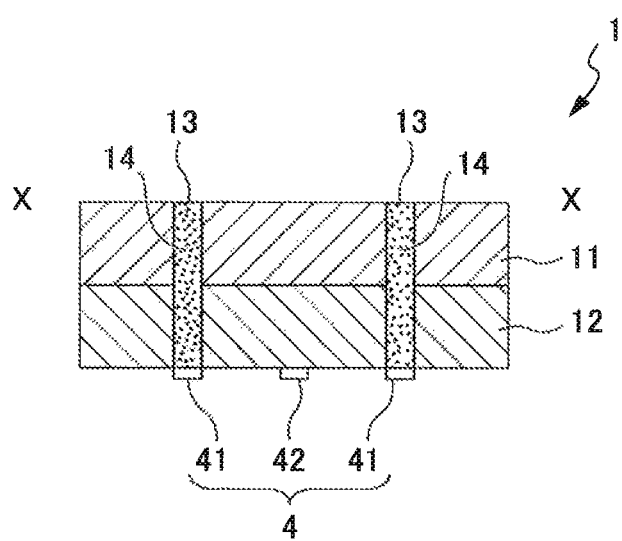
FIG. 2 is a cross-sectional view along line X-X of FIG. 1.

First, with reference to FIGS. 1 and 2, a back contact solar cell element 1 having through holes will be described as an example of a solar cell element for use in the first embodiment of the collector sheet for a solar cell according to the present invention. FIG. 1 is a perspective view schematically representing the solar cell element 1. FIG. 2 is a cross-sectional view along the line X-X of FIG. 1.

The solar cell element 1 for use in the present embodiment is configured of a photoreception surface side element 11 as an N-electrode and a non-photoreception surface side element 12 as a P-electrode which are vertically laminated, and the solar cell element 1 includes: a plurality of through holes 13 which penetrate through the photoreception surface side element 11 and the non-photoreception surface side element; and an electrode 4 configured of a first electrode 41 as a negative electrode which passes through the through holes 13 from the receiving surface side element 11, and a second electrode 42 as a positive electrode formed on the non-photoreception surface side.

It is to be noted that in the present specification, as an example the solar cell element 1 is illustrated where the photoreception surface side element is the N-electrode and the non-photoreception surface side element is the P-electrode, namely the first electrode 41 is the negative electrode and the second electrode 42 is the positive electrode. However, the configuration of the solar cell element is not limited thereto. For example, in the case of a solar cell element with the photoreception surface side being the P-electrode unlike FIG. 1, the positive and negative polarities of the first electrode 41 and the second electrode 42 are reversed. The collector sheet for a solar cell according to the present invention can also be used for the solar cell element with such a configuration. Also in that case, the completely same effect as in the present example can be exerted.

Specific examples of the back contact solar cell element having the through holes 13 include solar cell elements of the metal wrap through (MWT) type and the emitter wrap through (EWT) type. The MWT-type solar cell element refers to a solar cell element with a structure where the through hole 13 of the solar cell element 1 is filled with a metal such as silver paste 14, and electric power collected on the photoreception surface through the metal is extracted from the first electrode 41 (negative electrode) on the non-photoreception surface side. The EWT-type solar cell element refers to a solar cell element with a structure where a diffusion layer is provided on the inner wall of the through hole 13 of the solar cell element 1, and electric power collected on the photoreception surface through the diffusion layer is extracted from the first electrode (negative electrode) on the non-photoreception surface side.

It is to be noted that the collector sheet for a solar cell, for which the collector sheet for a solar cell according to the present invention can be used, is not necessarily limited to the solar cell element having the through holes 13 as described above. The collector sheet for a solar cell according to the present invention can be preferably used as the foregoing collector sheet capable of preventing short circuiting while softening shocks from the outside, so long as it is a back contact solar cell element disposed with a plurality of electrodes having different polarities on the non-photoreception surface, even in the case of being used for a solar cell element with a configuration not having the through hole 13. As an example, the collector sheet for a solar cell according to the present invention is also usable for an "interdigitated back-contact (IBC)"-type solar cell element. Here, the IBC-type solar cell element refers to a solar cell element with a structure where comb-shaped p-type and n-type diffusion layers are formed on the rear surface of the solar cell element and electricity is extracted from the p and n regions.

Figure 3:
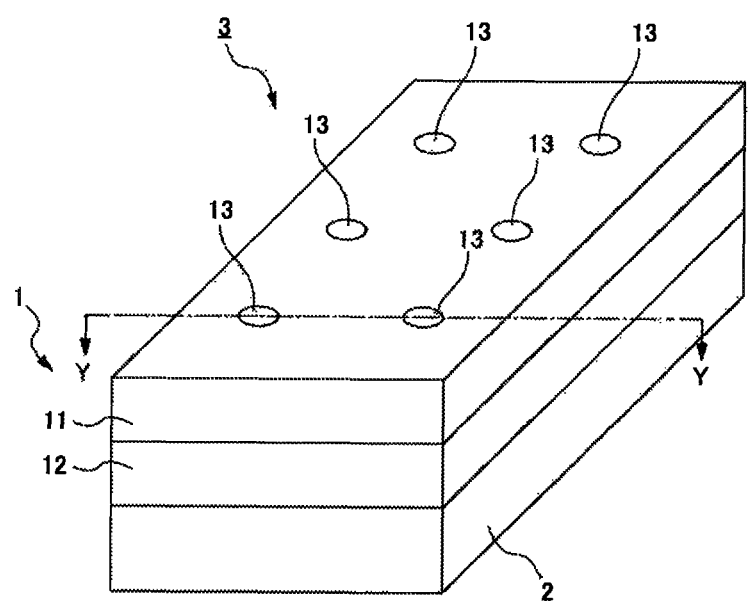
FIG. 3 is a perspective view schematically representing a joining member of a solar cell element and the collector sheet for a solar cell according to the present invention.
Figure 4:
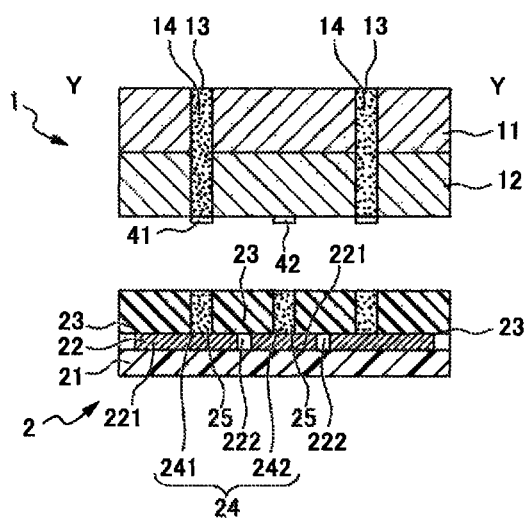
FIG. 4 is a sectional view of the joining member 3 of FIG. 3 along line Y-Y in a state prior to the joining of the solar cell element 1 and the collector sheet 2 for a solar cell (First Embodiment)
Figure 5:
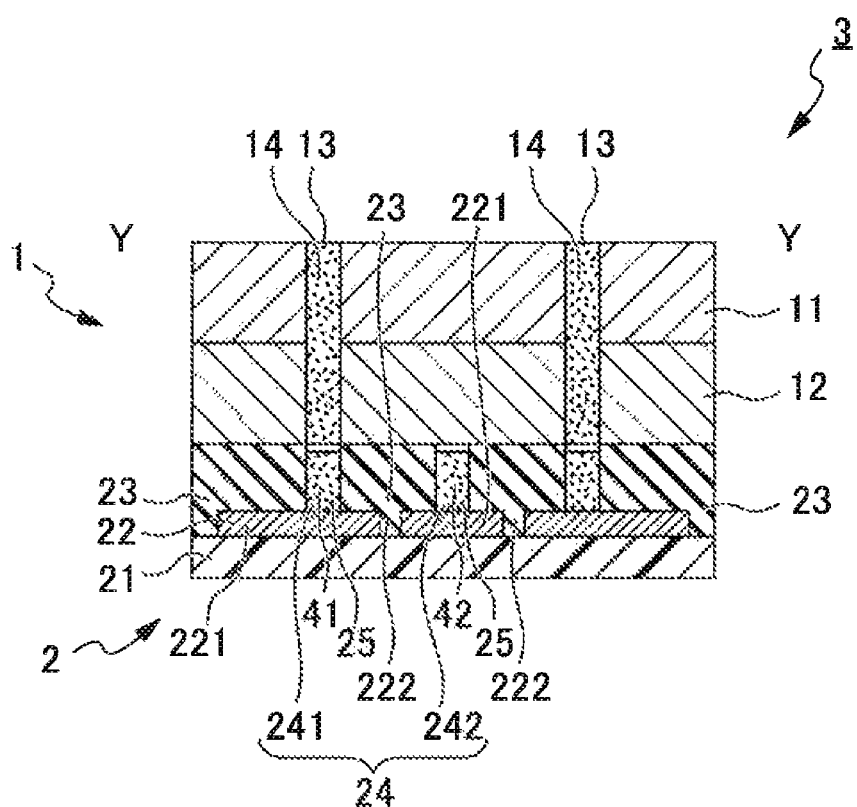
FIG. 5 is a cross-sectional view of the joining member 3 of FIG. 3 along the line Y-Y in the state after the joining of the solar cell element 1 and the collector sheet 2 for a solar cell (First Embodiment)

With reference to FIGS. 3 to 5, the embodiment of the collector sheet 2 for a solar cell according to the present invention will be described. FIG. 3 is a perspective view schematically representing the joining member 3 of the back contact solar cell element 1 having the through holes 13 and the collector sheet 2 for a solar cell according to the present invention. FIG. 4 is a sectional view of the joining member 3 of FIG. 3 along the line Y-Y in the state prior to the joining of the solar cell element 1 and the collector sheet 2 for a solar cell. FIG. 5 is a cross-sectional view of the joining member 3 of FIG. 3 along the line Y-Y in the state after the joining of the solar cell element 1 and the collector sheet 2 for a solar cell.

Collector Sheet for Solar Cell (First Embodiment)

The collector sheet 2 for the solar cell according to the present embodiment includes a resin base material 21, a circuit 22, a sealing material layer 23, and a conductive recessed section 24 formed in part of the sealing material layer 23. The circuit 22 configured of a wiring section 221 made of a metal such as copper and a non-wiring section 222 is formed on the surface of the resin base material 21. Then, the sealing material layer 23 is formed covering the circuit 22. Furthermore, a conductive recessed section 24 is formed penetrating from the upper surface of the sealing material layer 23 to the upper surface of the circuit 22.

The resin base material 21 is a resin molded into the shape of a sheet. Herein, the shape of a sheet is a concept including the shape of a film, and there is no difference between them in the present invention. Examples of the resin constituting the resin base material 21 include a polyethylene resin, a polypropylene resin, an annular polyolefin-based resin, a polystyrene-based resin, an acrylonitrile-styrene copolymer, an acrylonitrile-butadiene-styrene copolymer, a polyvinyl chloride-based resin, a fluorine-based resin, a poly(meth)acrylic resin, a polycarbonate-based resin, polyester-based resins such as polyethylene-terephthalate (PET) and polyethylenenaphthalate (PEN), a polyamide-based resin such as a variety of nylon, a polyimide-based resin, a polyamideimide-based resin, a polyallyl phthalate-based resin, a silicon-based resin, a polysulfone-based resin, a polyphenylene sulfide-based resin, a polyether sulfone-based resin, a polyurethane-based resin, an acetal-based resin and a cellulose-based one.

The thickness of the resin base material 21 may be set as appropriate in accordance with the strength, thinness and the like which are required for the collector sheet 2 for a solar cell. The thickness of the resin base material 21 is not particularly limited, but as one example thereof, 20 to 250 μm can be cited.

The circuit 22 is electric wiring formed on the surface of the collector sheet 2 for a solar cell so as to have the desired wiring shape. The wiring section 221 of the circuit 22 is a layer made of a metal such as copper. Examples of a method for forming the circuit 22 on the surface of the resin base material 21 include a method in which copper foil is joined to the surface of the resin base material 21 and the copper foil is then patterned by etching processing or the like.

The thickness of the circuit 22 may be set as appropriate in accordance with the magnitude of the withstand current or the like which is required for the collector sheet 2 for a solar cell. The thickness of the circuit 22 is not particularly limited, but as one example thereof, 10 to 50 μm can be cited.

As shown in FIG. 5, the sealing material layer 23 is formed on the circuit 22 except for the place occupied by the conductive recessed section 24. It is to be noted that the sealing material layer in the present invention is also called a filler, and is a layer configured of a filler such as an olefin-based resin base material, which is disposed for fixing the position of the solar cell element within the solar cell module and for softening shocks from the outside.

As the sealing material, there are conventionally known materials such as an ethylene-vinyl acetate copolymer resin (EVA), ionomer, polyvinyl butyl (PVB) or an olefin-based resin of polyethylene and the like, and any of these have characteristics of being capable of softening shocks from the outside in respect of shock softening characteristics.

Herein, for example, in the conventional collector sheet for a solar cell where the sealing material is not laminated on the circuit and the insulating layer made of thermosetting insulating ink or the like is formed on the circuit, the volume resistance value of the insulating layer which is measured based on JIS C6481 is required to be no smaller than $10^7\Omega$, preferably no smaller than $10^{11}\Omega$, so as to prevent short circuiting between the photoreception surface side element and the wiring section corresponding to the electrode with the opposite polarity to the element. The collector sheet for a solar cell according to the present example is one that makes the sealing material layer 23 also serve as the above insulating layer, and the short circuiting can be prevented by the resistance value of the sealing material layer 23 satisfying the above condition for the volume resistance value.

A sample was prepared for each of the EVA and the olefin-based resin used as the sealing material layer 23, and subjected to a test of insulating properties as described below.

The test on the insulating properties was performed by measuring volume resistance values of the below-mentioned samples based on JIS C6481. An ultra-insulation resistance tester (produced by HIOKI E.E. CORPORATION, Model Number: SM-8215) was used as a measuring instrument. An olefin-based resin described in Japanese Unexamined Patent Application No 2003-46105 and an EVA resin with a VA content of 28% were used as the samples, and the thickness of both samples was made to be 400 μm. Table 1 shows results.

TABLE 1

|  | EVA | Olefin-based resin |
|---|---|---|
| Volume resistance value | $1.4 \times 10^{12}\ \Omega$ | $1.5 \times 10^{12}\ \Omega$ |

It is found from Table 1 that the sealing material layer 23 using either the EVA or the olefin-based resin has sufficient insulating properties to prevent the above short circuiting in the collector sheet for a solar cell.

The sealing material layer 23 preferably has excellent metal adhesive properties to copper foil or the like that forms the wiring section 221 on the circuit 22, on top of having the foregoing shock softening properties and insulating properties. From this viewpoint, an ionomer which is excellent in metal adhesive properties is preferably usable as the sealing material layer 23. Furthermore, the metal adhesive properties of the olefin-based resin can be improved by blending a tackifier, silane-modifying part of the polyethylene resin or blending a silane coupling agent, and hence the olefin-based resin can be preferably used as the sealing material layer 23. From the above, the polyethylene-based resin or ionomer is particularly preferably used as the sealing material layer 23.

The thickness of the sealing material layer 23 is preferably 100 μm or more and 600 μm or less, and when it is smaller than 100 μm shocks cannot be sufficiently softened and the insulating properties also become insufficient, which is thus not preferable. Moreover, even when the thickness exceeds 600 μm, no further effect can be obtained, but pattern formation of the conductive recessed section 24 becomes rather difficult while it is uneconomical, which is thus not preferable.

The color of the sealing material layer 23 is not particularly limited. The material, resin may not be particularly colored and remain colorless or transparent or translucent, or may be colored with an arbitrary color. For example, by coloring it with a color having a high degree of light reflection such as white, it can reflect incident light and contribute to the improvement in power generation efficiency of the solar cell module, and by coloring it with white, black or the like, the design of the solar cell module can be enhanced.

As shown in FIGS. 4 and 5, at the time of joining the solar cell element 1 and the collector sheet 2 for a solar cell, the conductive recessed section 24 is configured of a first conductive recessed section 241 formed immediately under the first electrode (negative electrode) 41 of the solar cell element 1 and a second conductive recessed section 242 formed directly under the second electrode (positive electrode) 42 of the solar cell element 1. The first conductive recessed section 241 is a hole which has substantially the same shape and area as those of the through hole 13, as seen from the above surface of the solar cell element side in plan view, and penetrates from the upper surface of the sealing material layer 23 to the upper surface of the wiring section 221. On the other hand, although the second conductive recessed section 242 is also a hole which penetrates from the upper surface of the sealing material layer 23 to the upper surface of the wiring section 221, it may just be joined with the second electrode 42, and the shape and area thereof are thus designed to be appropriate in accordance with the shape and position of the second electrode 42.

At the time of joining the solar cell element 1 and the collector sheet 2 for a solar cell, the first conductive recessed section 241 is formed in a position where it is superimposed vertically on the through hole 13 with the first electrode 41 held between them, and the second conductive recessed section 242 is formed in a position where it is superimposed vertically on the through hole 13 with the second electrode 42 held between them. A space portion between the first conductive recessed section 241 and the second conductive recessed section 242 is filled with a conductive material 25 such as solder.

As thus described, the sealing material layer 23 in the collector sheet 2 for a solar cell as the first embodiment of the present invention can soften shocks from the outside by means of the shock softening properties thereof as conventionally known characteristics. Furthermore, in addition to the shock softening effect as a known effect of the conventional sealing material layer, the sealing material layer 23 in the present invention can exert a new effect of having enough insulating properties to prevent short circuiting, this effect having not hitherto been considered. Therefore, according to the collector sheet 2 for a solar cell, for example, a multi-layered structure where the insulating layer is first formed on the circuit and the sealing material layer is then formed as superimposed thereon is not required, but just a sealing material layer as a monolayer serves to perform shock softening and insulation, and hence just a small number of materials and steps are required in the production process, which can contribute to improvement in productivity. Method for producing collector sheet for solar cell In the production of the collector sheet 2 for a solar cell, first, a laminated sheet is used where a conductive layer made of a metal such as copper is laminated on the surface of the resin base material 21. An etching step and a peeling step are performed on this laminated sheet, to form the circuit 22 on the collector sheet 2 for a solar cell. Furthermore, a sealing material laminating step is performed on the laminated sheet formed with the circuit 22 to form the insulating layer 23 on the circuit 22. Hereinafter, the etching step, the peeling step, and the sealing material laminating step will be described.

[Etching Step]

First, the etching step will be described. This step is a step in which an etching mask (not shown) patterned into the desired shape of the circuit 22 is produced on the surface of the above laminated sheet and after this the etching processing is performed, thereby to remove the conductive layer in the place not covered with the etching mask.

As described above, the laminated sheet for use in this step is one in which the conductive layer made of a metal such as copper is formed on the surface of the resin base material 21. Examples of a method for forming the conductive layer made of a metal such as copper on the surface of the resin base material 21 include a method of making copper foil adhere to the surface of the resin base material 21 by an adhesive and a method of vapor-depositing the copper foil on the surface of the resin base material 21, but from the viewpoint of cost, the method of making copper foil adhere to the surface of the resin base material 21 by an adhesive is useful. Among them, preferred is a method of making the copper foil to be adhering to the surface of the resin base material 21 by a dry laminating method using an adhesive such as an urethane, polycarbonate or epoxy adhesive.

In this step, first, an etching mask (not shown) patterned into the desired shape of the wiring section 221 is produced on the shape of the surface of the above laminated sheet (namely, the surface of the above conductive layer). In the etching step, the etching mask is provided to avoid corrosion of the conductive layer, which will be the wiring section 221, due to an immersion liquid. The method for forming such an etching mask is not particularly limited, and for example, the etching mask may be formed on the surface of the laminated sheet by exposing a photoresist or a dry film through a photo mask and then developing it, or the etching mask may be formed on the surface of the laminated sheet by means of a printing technique such as an inkjet printer. In the peeling step which will be described later, the etching mask needs to be peelable by means of an alkaline peeling liquid. From this viewpoint, it is preferable to produce the etching mask by use of the photoresist or the dry film.

Next, the etching process in the etching step will be described. This process is for removing the conductive layer in the place not covered with the etching mask by means of the immersion liquid. Through this process, the portion other than the place to become the wiring section 221 is removed from the conductive layer, and hence the conductive layer is left in the desired shape of the wiring section 221 on the surface of the resin base material 21.

[Peeling Step]

Next, the etching mask is removed using the alkaline peeling liquid in the peeling step. Through this step, the etching mask is removed from the surface of the wiring section 221. Examples of the alkaline peeling liquid for use in the peeling step include a caustic soda solution with a predetermined concentration.

[Sealing Material Laminating Step]

Although the method for forming the rear surface sealing material layer 23 is not particularly limited, for example, after the sealing material has been formed into the shape of a sheet, a through hole is previously formed by punching or the like in a position to form the conductive recessed section 24, and the sealing material is then laminated, to allow formation of the penetrating conductive recessed section 24 on the circuit 22.

It is to be noted that, according to the above production method, strictly speaking, the sealing material layer 23 may not be formed in the non-wiring section 222 at the stage of laminating the sheet-like sealing material on the circuit, as shown in FIG. 4. However, in the process of vacuum heat lamination processing in a production process for the solar cell module which will be described later, the sealing material having been softened also flows into the non-wiring section 222 due to heat in accordance with the processing, and hence the sealing material layer 23 is also formed in the non-wiring section 222 as shown in FIG. 5.

Method for Producing Solar Cell Module

Next, a method will be described for producing a solar cell module provided with a joining member 3 formed by joining the solar cell element 1 with the collector sheet 2 for a solar cell as an embodiment of the present invention.

As shown in FIG. 5, first, the conductive recessed section 24 of the collector sheet 2 for a solar cell is filled with the conductive material 25 prior to the step of integrating the collector sheet 2 for a solar cell, the solar cell element 1 and the other members. Examples of this conductive material 25 may be solder and the like. Since the conductive recessed section 24 is thus formed so that the wiring section 221 is exposed on the bottom surface thereof, conductivity is provided between the conductive material 25 and the wiring section 221. More specifically, in FIG. 5, conductivity is provided by the sealer layer 23 between the wiring section 221 and the first conductive recessed section 241 connected to the first electrode 41 (negative electrode), and between the wiring section 221 and the second conductive recessed section 242 connected to the second electrode 42 (positive electrode), in a separate manner.

A back contact solar cell element, such as a MWT-type solar cell element shown in FIG. 5 or an EWT-type solar cell element, is used on the one solar cell element 1 side. In the case of the MWT-type solar cell element, the through hole 13 is filled with the silver paste 14 as shown in FIG. 5.

Next, the collector sheet 2 for a solar cell, the solar cell element 1 and the other members such as the rear surface protective sheet, not shown, are laminated and integrated. Examples of a method for this integration include a method for integration by vacuum heat lamination processing. The laminating temperature at the time of using the above method is preferably within the range of 130° C. to 190° C. Furthermore, the laminating time is preferably within the range of 5 to 60 minutes, and particularly preferably within the range of 8 to 40 minutes.

However, in this integration process, the sealing material layer 23 of the collector sheet 2 for a solar cell is softened and also flows into the non-wiring section 222 due to heating, and hence the sealing material layer 23 is also formed in the non-wiring section 222 as shown in FIG. 5. This allows the sealing material layer 23 to also function as an insulating layer for preventing short circuiting between the electrodes.

Furthermore, in this integration process, since the resin base material 21 of the collector sheet 2 for a solar cell is firmly integrated with other members as the solar cell module, no problem of shrinkage or deformation occurs due to heat even when heating is performed at Tg or higher of the resin base material of the collector sheet 2 for a solar cell.

It is to be noted that, although the collector sheet 2 for a solar cell according to the present invention refers to one where the sealing material layer 23 is laminated on the circuit 22, the collector sheet for a solar cell according to the present invention is not limited to one where the sealing material layer 23 is previously laminated on the circuit 22. A solar cell module is in the scope of the present invention, the module including: a circuit which is formed on the surface of a resin base material, and configured of a wiring section made of a metal and a non-wiring section; a sealing material layer laminated on the circuit; and a back contact solar cell element laminated on the sealing material layer.

By the above integration, as shown in FIG. 4, electricity extracted from the first electrode 41 passes through the silver paste 14 within the through hole 13 and is conducted to the corresponding wiring section 221 via the conductive material 25 within the first conductive recessed section 241. Furthermore, electricity extracted from the second electrode 42 becomes conductible to the corresponding wiring section 221 via the conductive material 25 within the second conductive recessed section 242.

Rear Surface Protective Sheet-integrated Collector Sheet

It is to be noted that, as described above, the collector sheet 2 for a solar cell becomes the solar cell module after going through the step of integration with other members besides the solar cell element 1, but prior to that step, a rear surface protective sheet (not shown) of a different ETFE or hydrolysis-resistant PET is previously integrated on the rear surface side of the resin base material 21, thereby allowing formation of the rear surface protective sheet-integrated collector sheet which is used for production of the solar cell module.

For creating the rear surface protective sheet-integrated collector sheet, the rear surface protective sheet is laminated on the rear surface side of the resin base material 21 by a dry lamination method or the like.

Collector Sheet for Solar Cell (Second Embodiment)

Hereinafter, a collector sheet for a solar cell and a method for producing the same according to the second embodiment of the present invention will be described. The constitutional elements in common with those in the first embodiment will be partially omitted, and the portion with a different constitutional element will be mainly described with reference to FIG. 6.

Figure 6:
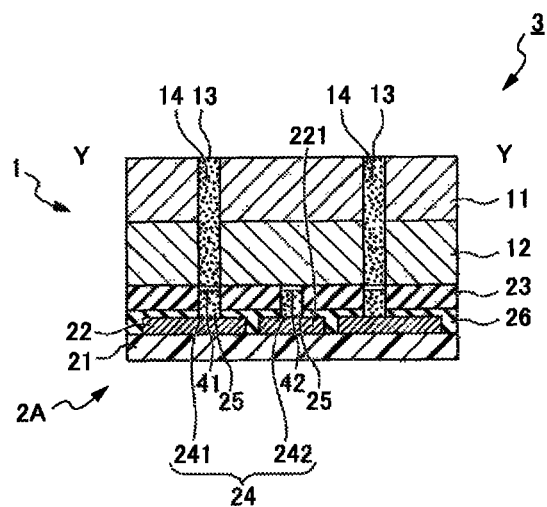
FIG. 6 is a cross-sectional view of the joining member 3 of FIG. 3 along the line Y-Y in the state after the joining of the solar cell element 1 and the collector sheet 2 for a solar cell (Second Embodiment).

As shown in FIG. 6, the collector sheet 2A for a solar cell according to the second embodiment is different from the collector sheet 2 for a solar cell according to the first embodiment in that an insulating layer 26 is formed on the circuit 22 and the sealing material layer 23 is formed on the insulating layer 26. According to the collector sheet 2A for a solar cell provided with such a configuration, it is possible to provide a collector sheet for a solar cell which can more reliably prevent short circuiting between the non-photoreception surface side element and the wiring section than the collector sheet 2 for a solar cell, as well as softening shocks from the outside.

The collector sheet 2A includes the resin base material 21, the circuit 22, the insulating layer 26 and the sealing material layer 23 (hereinafter, both layers in combination are also referred to as an "insulating sealing material layer"), and the conductive recessed section 24 formed in part of the insulating sealing material layer. The insulating layer 26 is formed covering the circuit 22, and the sealing material layer 23 is formed on the upper surface of the insulating layer 26. Furthermore, the conductive recessed section 24 is formed penetrating from the upper surface of the sealing material layer 23 to the upper surface of the circuit 22 through the insulating layer 26.

The insulating layer 26 is formed on the circuit 22 except for the place occupied by the conductive recessed section 24. In the collector sheet 2A for a solar cell, the above short circuiting can be prevented when the resistance value in the case of measuring the resistance value of the insulating sealing material layer formed by integrating the insulating layer 26 and the sealing material layer 23 satisfies conditions for the above volume resistance value.

In the collector sheet 2A for a solar cell, an ultraviolet curable insulating agent can be used as the insulating agent for forming the insulating layer 26 as a coat agent in place of thermosetting insulating ink such as epoxy-phenol based ink, which has hitherto been widely used and has extremely high insulating properties. The ultraviolet curable insulating coat agent is inferior to thermosetting insulating ink in respect of insulating properties in the case of forming an insulating layer alone. However, sufficient insulating properties can be obtained even in the insulating layer using the ultraviolet curable insulating coat agent by laminating the sealing material layer 23 thereon to give a multiple layered insulating sealing material layer as shown in FIG. 6.

It should be noted that by using the ultraviolet curable insulating coat agent in place of the thermosetting insulating ink, the curing temperature of the ink at the time of forming the insulating layer can be held low. Therefore, polyethylene terephthalate (PET) or the like, which has a glassy-transition temperature of 100° C. or higher and has higher economic efficiency, can be used as the resin base material 21. Furthermore, ultraviolet curing is superior to thermosetting in respect of economic efficiency. Therefore, using the ultraviolet curable insulating coat agent as the insulating agent for forming the insulating layer 26 allows improvement in productivity of the collector sheet for a solar cell or the solar cell module.

The thickness of the insulating layer 26 is preferably 5 μm or more and 25 μm or less. When the thickness is smaller than 5 μm, it is not preferable since the insulating properties become insufficient even if the sealing material layer is laminated; and even when the thickness exceeds 25 μm, no further effect can be obtained, but pattern formation of the conductive recessed section 24 becomes rather difficult while it is uneconomical, which is thus not preferable.

As shown in FIG. 4, the sealing material layer 23 of the collector sheet 2A for a solar cell is formed on the insulating layer 26 except for the place occupied by the conductive recessed section 24. That is, in the collector sheet 2A for a solar cell, the conductive recessed section 24 is formed by communication between a recessed section formed of an unformed section in the insulating layer 26 and a hole section formed in the sealing material layer 23 which is formed on the recessed section.

The sealing material layer 23 of the collector sheet 2A for a solar cell is laminated with the insulating layer 26 to form the insulating sealing material layer, which can bring a new effect of exerting higher insulating properties for the whole of the insulating sealing material layer as compared to the case of the insulating layer 26 being disposed alone, this effect having not been required of the sealing material in the conventional collector sheet for a solar cell.

The thickness of the sealing material layer 23 of the collector sheet 2A for a solar cell is preferably 100 μm or more and 600 μm or less. When the thickness is smaller than 100 μm, shocks cannot be sufficiently softened and the effect of enhancing the insulating properties becomes insufficient, which is not preferable; and even when the thickness exceeds 600 μm, no further effect can be obtained, but pattern formation of the conductive recessed section 24 becomes rather difficult while it is uneconomical, which is thus not preferable.

Method for Producing Collector Sheet for Solar Cell (Second Embodiment)

In the production of the collector sheet 2A for a solar cell, subsequently to the etching step and the peeling step similar to those in the case of producing the collector sheet 2 for a solar cell according to the first embodiment, an insulating coating step for forming the insulating layer 26 is performed. Then it is different from the foregoing production method according to the first embodiment in that a sealing material coating step is performed by laminating the sealing material layer 23 on the formed insulating layer 26. Regarding the production method according to the second embodiment, the insulating coating step and the sealing material laminating step will be described below.

[Insulating Coating Step]

Insulating coating can be performed by a method using light or a thermosetting insulating coat agent.

Specifically, the ultraviolet curable insulating coat agent is applied covering a portion except for the conductive recessed section 24 out of the wiring section 221 and the non-wiring section 222 of the circuit 22, and thereafter this is cured by irradiation with ultraviolet light to perform insulating coating. In this case, the ultraviolet curable insulating coat agent like an acrylic one can be favorably used.

Moreover, the insulating coating can also be performed by a method using a conventionally known insulating agent such as a thermosetting insulating ink like an epoxy-phenol based ink.

[Sealing Material Laminating Step]

Although the method for forming the rear surface sealing material layer 23 of the collector sheet 2A for a solar cell is not particularly limited, for example, after the sealing material has been formed into the shape of a sheet, a through hole is previously formed by punching or the like in a position to form the conductive recessed section 24, and the sealing material is then laminated so that the recessed section formed by the insulating layer 26 and the through hole are superimposed on each other, to allow formation of the penetrating conductive recessed section 24 on the circuit 22.

As described above, each of the collector sheets 2, 2A for a solar cell according to the present invention includes the sealing material layer 23, or the insulating sealing material layer configured of the insulating layer 26 and the sealing material layer 23, which can realize insulation between, for example, the non-photoreception surface side element 12 and the wiring section 221 while softening shocks from the outside on the solar cell element 1 and the like at the time of joining with the solar cell element 1, and by using this collector sheet 2 for a solar cell for extracting electricity from the solar cell element 1, it is possible to prevent short circuiting between the non-photoreception surface side element 12 as the P-electrode and the wiring section corresponding to the N-electrode, and at the same time it is possible to appropriately protect the solar cell element 1 and the like from shocks from the outside.

The invention claimed is:

1. A collector sheet, the sheet comprising:
   a resin base material which is the outermost layer of the collector sheet on its backside;
   a circuit which is formed on a front side surface of the resin base material, and configured of a wiring section made of a metal and a non-wiring section; and
   a sealing material layer which is the outermost layer of the collector sheet on its front side surface and is arranged on the circuit via no other insulating layer,
   wherein the sealing material layer is a polyethylene-based resin, and the volume resistance value of the sealing material layer measured based on JIS C6481 is no smaller than $10^7 \Omega$ and no greater than $10^{12} \Omega$, and the thickness thereof is no smaller than 100 μm and no greater than 600 μm, and
   wherein the sealing material layer on the wiring section is formed with a conductive recessed section where the wiring section is exposed and provides conductivity between an electrode on a non-photoreception surface side of a solar cell element and the wiring section corresponding thereto via the sealing material layer.

2. The collector sheet according to claim 1, comprising, as the conductive recessed section:
   a first conductive recessed section corresponding to a position of a first electrode being one of the positive and negative electrodes formed on the non-photoreception surface side through a through hole from a photoreception surface side element of the solar cell element; and
   a second conductive recessed section corresponding to the position of a second electrode being the other of the positive and negative electrodes on the non-photoreception surface of the solar cell element.

3. A solar cell module, which comprises a joining member formed by laminating the collector sheet according to claim 2 on the non-photoreception surface side of a back contact solar cell element, wherein
   the solar cell element is configured of a photoreception surface side element and a non-photoreception surface side element, and provided with a first electrode which is one of the positive and negative electrodes formed on the non-photoreception surface side through a through hole from a photoreception surface side element, and a second electrode which is the other of the positive and negative electrodes formed on the non-photoreception surface,
   the first and second conductive recessed sections of the collector sheet are filled with a conductive material,
   the first electrode and the conductive material within the first conductive recessed section are joined so as to provide conductivity between them, and
   the second electrode and the conductive material within the second conductive recessed section are joined so as to provide conductivity between them.

4. The method for producing the collector sheet according to claim 2, comprising the steps of:
   laminating metal foil on the surface of the resin base material and then etching the metal foil, to form a circuit; and
   forming a through hole that constitutes the conductive recessed section in the sealing material layer, and laminating the sealing material layer on the circuit.

5. A solar cell module, comprising:
   the collector sheet according to claim 2; and
   a back contact solar cell element laminated on the sealing material layer on the collector sheet.

6. A method for producing the collector sheet according to claim 1, comprising the steps of:
   laminating metal foil on the surface of the resin base material and then etching the metal foil, to form a circuit; and forming a through hole that constitutes the conductive recessed section in the sealing material layer, and laminating the sealing material layer on the circuit.

7. A solar cell module, comprising:

the collector sheet according to claim 1; and a back contact solar cell element laminated on the sealing material layer.

* * * * *